United States Patent [19]

Russo

[11] Patent Number: 4,465,979
[45] Date of Patent: Aug. 14, 1984

[54] UHF ANTENNA AMPLIFIER HAVING PLANAR TRANSFORMERS

[75] Inventor: Richard Russo, Parkton, Md.

[73] Assignee: Fred S. Eichelberger, White Hall, Md. ; a part interest

[21] Appl. No.: 433,524

[22] Filed: Oct. 8, 1982

[51] Int. Cl.³ .............................................. H03F 3/60
[52] U.S. Cl. ...................................... 330/66; 330/286
[58] Field of Search ................. 330/56, 66, 286, 302, 330/307; 333/246; 361/399

[56] References Cited

U.S. PATENT DOCUMENTS 3,317,671  5/1967  Mitchell et al. ................ 330/307 X
3,848,198  11/1974  De Brecht et al. ............. 330/286 X

FOREIGN PATENT DOCUMENTS 56615  12/1968  Poland .................................. 330/66

Primary Examiner—James B. Mullins
Assistant Examiner—Steven J. Mottola
Attorney, Agent, or Firm—Birch, Stewart, Kolasch & Birch

[57] ABSTRACT

A UHF amplifier device interfaces between an antenna and a signal receiver. A circuit board has first and second planar input and output transformers formed within first and second grounding planes on the circuit board. An amplifier is formed intermediate the first and second planar transformers for amplifying UHF signals received from the antenna. Each of the input and output planar transformers include a first rectilinear leg and a rectilinear helix disposed in the same plane.

15 Claims, 6 Drawing Figures

4,465,979

UHF ANTENNA AMPLIFIER HAVING PLANAR TRANSFORMERS

FIELD OF THE INVENTION

This invention relates to a signal amplifier for operation within the 470 to 890 MHZ frequency range. More specifically, the signal amplifier of the present invention is primarily for use with television receivers for the purpose of amplifying television transmission received by an antenna within the UHF broadcast band.

BACKGROUND OF THE INVENTION

With the introduction and proliferation of UHF television channels, a need has been demonstrated for amplifier devices capable of improving the quality of reception in various locales and fringe areas.

The UHF converters in many television receivers presently manufactured incorporate UHF converters which utilize one or more diodes as signal mixers, thereby providing tuners which offer little or no gain and which add appreciable noise to the signal being down-converted.

Another problem which is often encountered is that many multi-band antennas produced for the consumer are typically of 300 ohm impedance which allows the use of inexpensive antenna leads to the television receiver. However, in order to amplify the input from such a signal it is often necessary to convert to a 75 ohm input impedance at the television receiver.

The average consumer encounters difficulty in receiving UHF broadcasts, and in producing quality television reception. This problem is due to one or more of the following factors: Attenuation of transmitted signals due to atmospheric or terrestrial conditions, low gain produced by multi-band antennas, losses induced by open 300 ohm transmission line interconnecting antenna with receiver, and finally, poor signal gain in the television receiver itself.

Some UHF amplifiers manufactured for the consumer at present require transformer coupling with the consumer's existing antenna/receiver system which renders the installation relatively complex at the consumer level and quite often results in the inefficient operation of such amplifiers with a corresponding lack of improvement in television reception.

OBJECT OF THE INVENTION

It is an object of the present invention to provide an amplifier which is efficient in operation, small in size and which can easily be interfaced with the consumer's antenna and television receiving equipment by providing the proper 300/75 ohm input/output impedance characteristic.

SUMMARY OF THE INVENTION

The amplifier of the present invention is constructed on a printed circuit board made of glass/epoxy with a G-10 rating upon which a portion of the circuity is made an integral part of the circuit board itself.

The amplifier contained wholly on the board except for an external power source is contained in a polycarbonate plastic enclosure having input/output terminals at opposite ends thereof and an access connector opening through the enclosure to provide a bias connection from a suitable low voltage power supply to the amplifier circuit.

The circuit is completely sealed in an epoxy resin to reduce the effects thereon of humidity and temperature variations and is further characterized by the use of stripline technology to form planar input and output transformers located on opposite ends and on opposite major surfaces of the circuit board and formed within the confines of opposed coextensive substantially rectangular grounding planes provided on opposite major surfaces of the said circuit board. The ground planes provide sufficient isolation of the input/output signals of the amplifier device of the present invention to allow stable operation and are comprised from a suitable metallic layer adaptable to high frequency operation and stripline technology.

The input and output transformers provide an impedance conversion within the amplifier device from 300 ohms to approximately 50 ohms and thence provide a balanced 300 ohm output such that the television receiver and the antenna are properly interfaced through an impedance match.

The amplifier device of the present invention is a modular self-contained unit which incorporates the use of a quick detachable fabric fastener such as those produced under the trademark Velcro, with one component of the fastener being on the amplifier housing and the other component being adapted to be secured such as by pressure-sensitive adhesive to the television receiver.

DETAILED DESCRIPTION OF THE DRAWINGS

Figure 1:
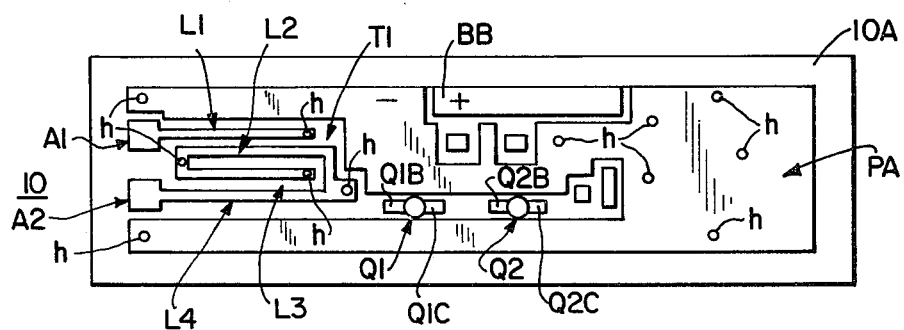
FIG. 1 is a top plan view of a first major surface of the circuit board of the amplifier device of the present invention.
Figure 2:
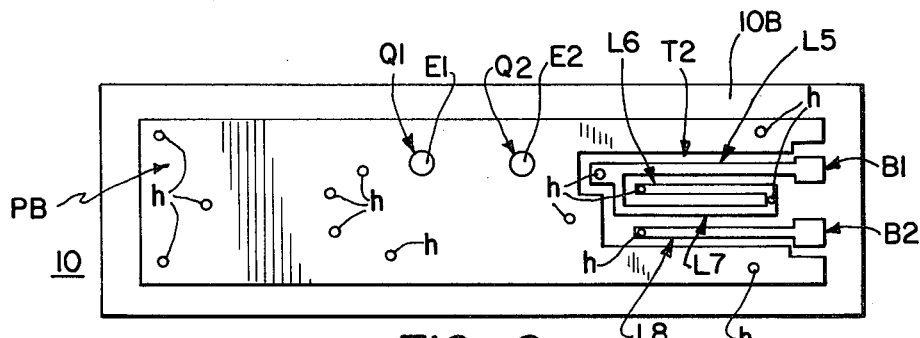
FIG. 2 is a bottom plan view of the circuit board of the amplifier device of the present invention.

Referring in detail to the drawings and with particular reference to FIGS. 1 and 2, a circuit board 10 of the amplifier device of the present invention is illustrated as including a first major surface 10A and opposed major surface 10B upon which grounding planes PA and PB are respectively located.

The first major surface holding the first grounding plane PA also includes at the left-hand end thereof as illustrated in FIG. 1 a stripline transformer T1 which is comprised of lines L1, L2, L3 and L4 which, because of their resonance characteristics over the intended frequency range of operation, comprise a transformer. The first line L1 is independent of the lines L2, L3 and L4, the latter three lines comprising portions of a rectilinear but serpentine configuration leading from one of the input terminals A2, the single stripline L1 being attached to the other of the input terminals A1.

Provision is made for interconnecting an external voltage source to the circuit board 10 by application of the voltage to a stripline voltage bus BB on the first major surface 10A formed within and electrically isolated from the first grounding plane PA along one longitudinal edge of the latter. The negative terminal of the voltage source is applied to the grounding plane PA.

On the second major surface 10B within the confines of the second grounding plane PB, which is coextensive with and positioned directly opposite the first grounding plane PA, is a second (output) transformer T2. The second transformer T2 is on the right-hand end of the second grounding plane PB, the end opposite to that of the first (input) transformer T1. The second (output) transformer T2 is formed from fifth, sixth and seventh striplines L5, L6 and L7, respectively, extending from a first output terminal B1 at one end of the fifth stripline L5 inwardly to an apparent free end on the sixth stripline L6 at the interior portion of the rectilinear serpentine array. A single eighth stripline L8 is positioned parallel to the seventh stripline L7 and has at its outboard end a second output terminal B2. Here, as in the case of the first (input) transformer T1 the second (output) transformer T2 is provided by virtue of the resonance characteristics of the individual fifth, sixth, seventh and eighth striplines L5 . . . L8 in the particular configuration illustrated over the UHF frequency range for which the amplifier device of the present invention is designed.

Figure 3:
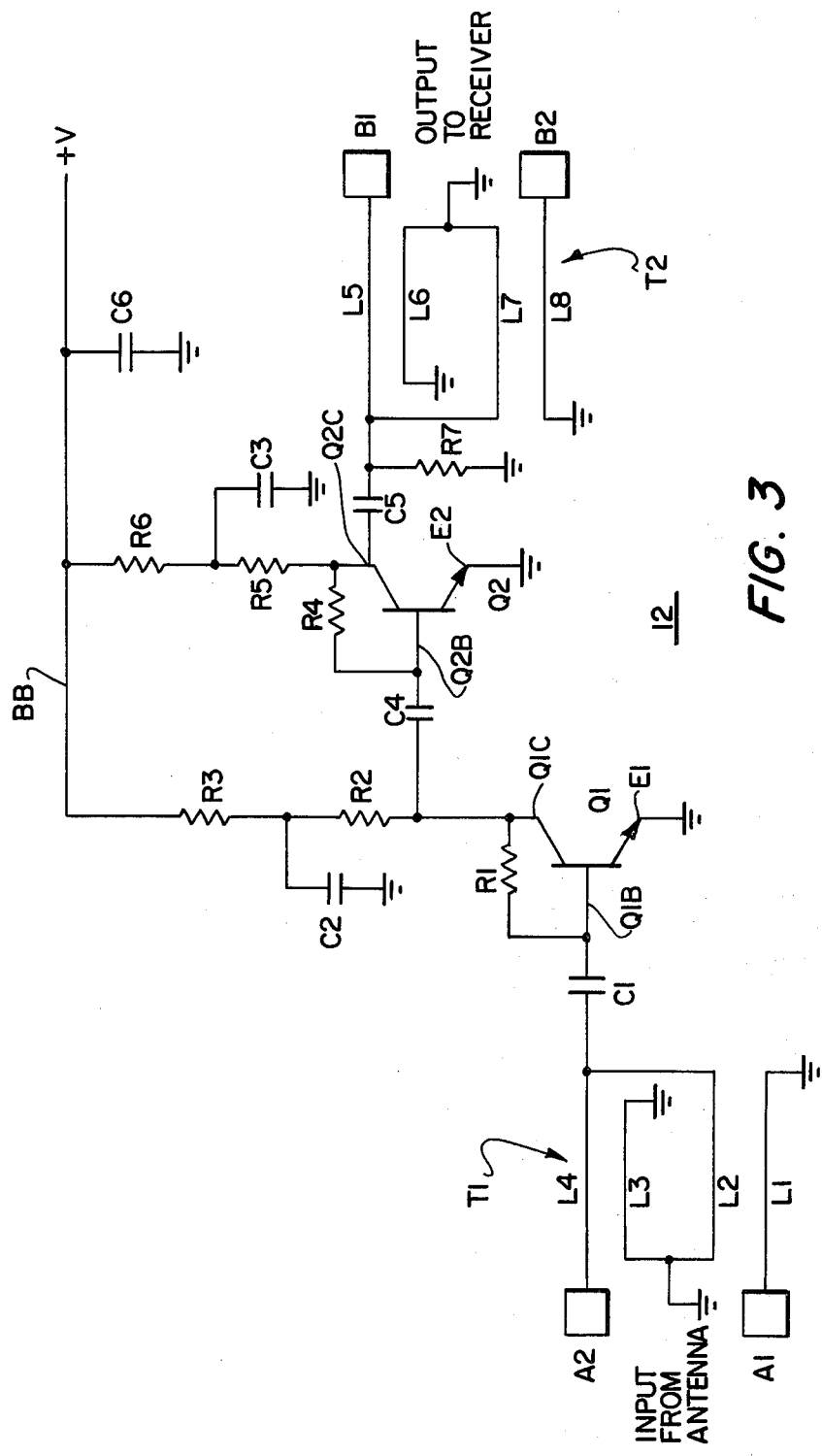
FIG. 3 is a schematic of the amplifier circuit for the amplifier device of the present invention.

A plurality of plated through holed h are illustrated for connecting various transformer striplines, components and grounding planes one to the other as will be illustrated by the circuit interconnections in the schematic diagram of FIG. 3.

As further illustrated in FIGS. 1 and 2, first and second transistors Q1 and Q2, respectively, are illustrated with their emitter terminals E1 and E2 illustrated as connected with the grounding plane PB in FIG. 2 and their base and emitter terminals Q1B, Q2B and Q1C, Q2C, respectively, connected by means of printed circuit strips within the confines of the first grounding plane PA on the first major surface 10A of the circuit board 10.

Referring now to FIG. 3, the circuit of the amplifier device 12 of the present invention is illustrated as having the input from the input terminals A1/A2 connected to drive the base Q1B of the transformer T1 through a first capacitor C1 from the common junction between the second and fourth striplines L2 and L4 in the input transformer T1.

A first biasing resistor R1 is connected from the base Q1B to the collector Q1C of the first transistor Q1, the emitter E1 of which is shown as grounded in the schematic diagram. The collector Q1C of the first transistor Q1 is thence connected through series resistors R2 and R3 to the voltage bus BB which as illustrated is connected to a source of positive voltage indicated by +V. A capacitance C2 is connected to ground from the common junction between the second and third divider resistors R2 and R3. This completes the operating circuit for the first transistor Q1.

The collector Q1C of the first transistor Q1 drives the base Q2B of the second transistor Q2 through a fourth capacitance C4. The said base Q2B of the second transistor Q2 is connected through a fourth biasing resistor R4 to the collector Q2C of the second transistor Q2 and thence through series connected fifth and sixth resistors R5 and R6, respectively, to the voltage bus BB, the common junction between the fifth and sixth resistors R5 and R6 being bypassed through a third capacitance C3 to complete the output circuit for the second transistor Q2. The voltage bus BB itself is coupled to ground through a sixth capacitor C6 to isolate the overall bias circuit for the first and second transistors Q1 and Q2. As indicated, the emitter E2 of the second transistor Q2 is connected to ground.

The output of the two amplifier stages defined by the transistors Q1 and Q2 is taken through a fifth capacitance C5 to the common terminal between the fifth and seventh striplines L5 and L7 of the output transformer T2, the output being referenced to ground from the same common junction through a seventh resistance R7. The output thus appears across the output terminals B1 and B2 completing the circuit for the amplifying device of the present invention.

As further illustrated in FIG. 3, in the input transformer T1, the common junction between the second and third striplines L2 and L3 is grounded as is the free end of the third stripline L3. The free end of the first stripline L1 is also grounded.

With reference to the output transformer T2, the common junction between the sixth and seventh striplines L6 and L7 is grounded as is the free end of the sixth stripline L6. The free end of the eighth stripline L8 is also grounded. The ground connections for the entire circuit of FIG. 3 are provided by means of either direct connections to the respective ones of the grounding planes PA and PB or as in the case of the various transformer striplines, through the plated through holes h in the circuit board 10. The first and second grounding planes PA and PB are also interconnected through the plated through holes h so that a common ground exists and the configuration is properly tuned and matched for operation within the UHF broadcast band.

Figure 4:
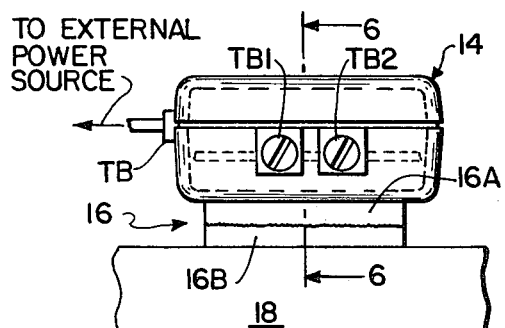
FIG. 4 is an input end view of the housing and external input terminals of the amplifier device of the present invention.
Figure 5:
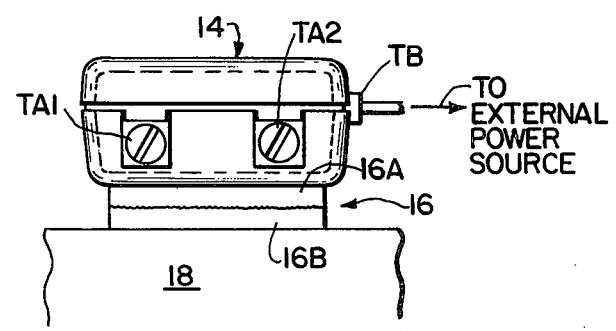
FIG. 5 is an output end view of the housing and external output terminals of the amplifier device of the present invention.
Figure 6:
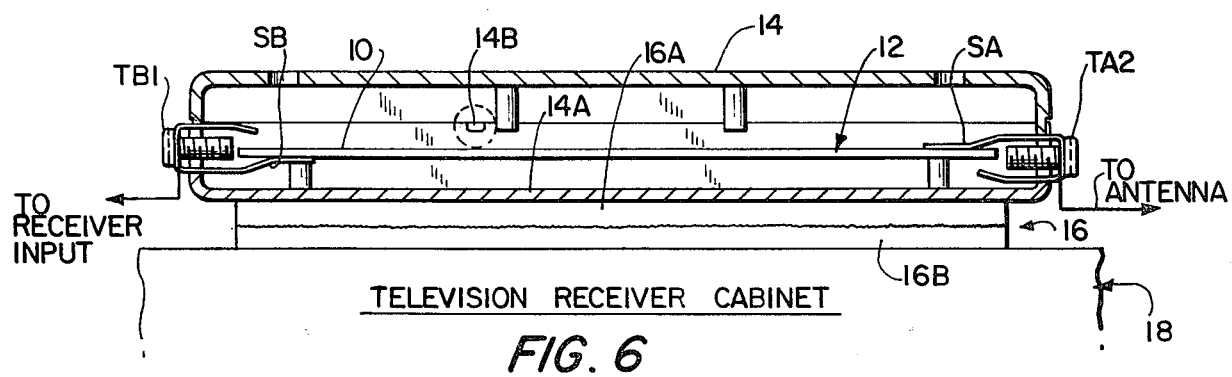
FIG. 6 is a cross-section taken along line 6—6 of FIG. 4.

Referring now to FIGS. 4, 5 and 6, the plastic housing 14 for the amplifying device 12 is illustrated with the amplifying device 12 generally shown in schematic form as housed within the plastic outer housing 14.

Affixed to the lower surface 14A of the housing 14 is one half 16A of a quick release fastener generally indicated at 16, the said fastener having a lower portion 16B which is glued as by adhesive or fixed releasably and quickly by other means to the top surface of a television receiver cabinet 18 or the like to permit the housing 14 containing the amplifying device 12 to be quickly mounted upon a television receiver cabinet in proximity to both antenna and input connections for an associated television receiver.

As illustrated in FIG. 5, first and second input terminals TA1 and TA2 are provided which correspond, respectively, to input terminals A1 and A2 on the circuit board 10 of the amplifying device 12. At the opposite end of the housing 14 are provided first and second output terminals TB1 and TB2 corresponding, respectively, to the amplifier output terminals B1 and B2 of the amplifier 12.

Also provided in one side of the housing 14 is a half-round access opening 14B through which a voltage terminal TB is extended to engage the voltage bus BB on the first major surface PA of the circuit board 10 in any suitable manner known to those or ordinary skill in the art. For example, the input and output terminals TA1, TA2 and TB1, TB2, respectively, include contact strips SA and SB which extend into the housing 14 to make contact with the respective input and output terminals A1, A2 and B1, B2 of the amplifier device 12. A similar connecting structure is contemplated for the voltage terminal connection TB extending from access opening 14B and connecting the device to a 9 V battery or power supply as is known in the art.

The entire interior of the housing 14 is filled with epoxy compound to pot the entire amplifier device 12 of the present invention firmly within the outer housing 14 and protect it from the effects of humidity and temperature.

In operation, the housing 14 is affixed to a television cabinet 18 by means of the fastener device 16, and the input terminals TA1 and TA2 are wired to the antenna leads of the television receiving antenna while the output terminals TB1 and TB2 are wired to respective television receiver input terminals provided for normal antenna connection.

A suitable source of external bias is connected to bias terminal TB and the amplifier is rendered operative not only to amplify signals received in the UHF band by the UHF antenna but to match the impedance of that antenna with the impedance of the television receiver by virtue of the input and output transformers T1 and T2 while at the same time providing an internal impedance conversion for the amplifier 12 for optimum operating characteristics within the desired frequency range.

It should be understood that the system described hereinbefore may be modified as would occur to one skilled in the art without departing from the spirit and scope of the present invention.

We claim:

1. An amplifier device for use in the 470-890 MHZ frequency range comprising:
    a circuit board having substantially rectangular and coextensive first and second grounding planes on respectively opposed major surfaces thereof;
    first and second planar transformer means at opposite ends of said circuit board formed within said first and second grounding planes, respectively;
    isolated conductive areas defined in relieved portions of said first grounding plane underlying respective electronic components and constituting external connector means for said components;
    plated through hole means in said board for interconnecting said components and said transformer means with selected ones of said grounding planes and said grounding planes with each other;
    said first transformer means including first terminal means, for receiving input signals from an external source;
    said second transformer means including second terminal means for delivering amplified output signals representative of said input signals to an external device; and
    amplifier means comprised of said electronic components interconnecting said first and second transformer means and acting in conjunction therewith to interface the impedance of said external source to the impedance of said external device.

2. The amplifier device of claim 1 which further includes housing means for containing said circuit board, said transformer means and said amplifier means; and
    mounting means integral with said housing means for detachably securing said amplifier device to a desired surface.

3. The amplifier device of claim 1 wherein said amplifier means comprises:
    first and second transistor means each having base, collector and emitter terminals and mounted in said circuit board through respective ones of said isolated conductive areas with said emitter terminals connected to said second grounding plane;
    bias means for applying a bias voltage to said collector terminals of said transistor means and connected with said collector terminals through respective bias circuit means;
    first coupling means connecting said first transformer means to the base terminal of said first transistor means to drive the latter with said input signal;
    second coupling means connecting the collector terminal of said first transistor means with the base terminal of said second transistor means to drive the latter with an amplified input signal to generate said amplified output signals; and
    third coupling means connecting the collector terminal of said second transistor means with said second transformer means to drive the latter with and thereby apply the amplified output signal to said second terminal means for delivery to a said external device.

4. The amplifier device of claim 3 which further includes housing means for containing said circuit board, said transformer means and said amplifier means; and
    mounting means integral with said housing means for detachably securing said amplifier device to a desired surface.

5. The amplifier device of claim 3 wherein each said planar transformer means comprises:
    a first rectilinear leg extending from one of its corresponding said terminal means to a plated-through hole means grounding that first leg to one of said grounding planes; and
    a rectilinear helix extending from another of its corresponding terminal means and defining second, third and fourth rectilinear parallel legs, said second leg being parallel with said first and in series with said fourth leg between a grounding plane and the said another corresponding terminal means with said third leg being grounded at both ends thereof and lying intermediate said second and fourth legs.

6. The amplifier device of claim 5 which further includes housing means for containing said circuit board, said transformer means and said amplifier means; and
    mounting means integral with said housing means for detachably securing said amplifier device to a desired surface.

7. The amplifier device of claim 1 wherein each said planar transformer means comprises:
    a first rectilinear leg extending from one of its corresponding said terminal means to a plated-through hole means grounding that first leg to one of said grounding planes; and
    a rectilinear helix extending from another of its corresponding terminal means and defining second, third and fourth rectilinear parallel legs, said second leg being parallel with said first and in series with said fourth leg between a grounding plane and the said another corresponding terminal means with said third leg being grounded at both ends thereof and lying intermediate said second and fourth legs.

8. The amplifier device of claim 7 which further includes housing means for containing said circuit board, said transformer means and said amplifier means; and
    mounting means integral with said housing means for detachably securing said amplifier device to a desired surface.

9. The amplifier device of claim 1 wherein said amplifier device further includes bus means formed within one of said grounding planes for connection to an external voltage source.

10. The amplifier device of claim 9 which further includes housing means for containing said circuit board, said transformer means and said amplifier means; and mounting means integral with said housing means for detachably securing said amplifier device to a desired surface;

said housing means further including access means for permitting interconnection of said bus means with a said external voltage source.

11. The amplifier device of claim 1 wherein said amplifier means comprises:

first and second transistor means each having base, collector and emitter terminals and mounted in said circuit board through respective ones of said isolated conductive areas with said emitter terminals connected to said second grounding plane;

supply means for applying a supply voltage to said collector terminals of said transistor means and connected with said collector terminals through respective supply circuit means;

first coupling means connecting said first transformer means to the base terminal of said first transistor means to drive the latter with said input signal;

second coupling means connecting the collector terminal of said first transistor means with the base terminal of said second transistor means to drive the latter with an amplified input signal to generate said amplified output signals; and third coupling means connecting the collector terminal of said second transistor means with said second transformer means to drive the latter with and thereby apply the amplified output signal to said second terminal means for delivery to a said external device;

said amplifier device further including bus means formed within one of said grounding planes for interconnecting said supply means with said supply circuit means.

12. The amplifier device of claim 11 which further includes housing means for containing said circuit board, said transformer means and said amplifier means; and mounting means integral with said housing means for detachably securing said amplifier device to a desired surface;

wherein said supply means is external to said housing means; and wherein said housing means includes access means for permitting interconnection of said supply means with transistor means.

13. The amplifier device of claim 11 wherein each said planar transformer means comprises:

a first rectilinear leg extending from one of its corresponding said terminal means to a plated-through hole means grounding that first leg to one of said grounding planes; and a rectilinear helix extending from another of its corresponding terminal means and defining second, third and fourth rectilinear parallel legs, said second leg being parallel with said first and in series with said fourth leg between a grounding plane and the said another corresponding terminal means with said third leg being grounded at both ends thereof and lying intermediate said second and fourth legs.

14. The amplifier device of claim 9 wherein each said planar transformer means comprises:

a first rectilinear leg extending from one of its corresponding said terminal means to a plated-through hole means grounding that first leg to one of said grounding planes; and a rectilinear helix extending from another of its corresponding terminal means and defining second, third and fourth rectilinear parallel legs, said second leg being parallel with said first and in series with said fourth leg between a grounding plane and the said another corresponding terminal means with said third leg being grounded at both ends thereof and lying intermediate said second and fourth legs.

15. The amplifier device of claim 14 which further includes housing means for containing said circuit board, said transformer means and said amplifier means; and mounting means integral with said housing means for detachably securing said amplifier device to a desired surface;

said housing means further including access means for permitting interconnection of said bus means with a said external voltage source.

* * * * *